United States Patent
Ko et al.

(10) Patent No.: US 7,576,407 B2
(45) Date of Patent: Aug. 18, 2009

(54) DEVICES AND METHODS FOR CONSTRUCTING ELECTRICALLY PROGRAMMABLE INTEGRATED FUSES FOR LOW POWER APPLICATIONS

(75) Inventors: Young-Gun Ko, Fishkill, NY (US); Ja-Hum Ku, Seongnam-si (KR); Minchul Sun, Fishkill, NY (US); Robert Weiser, Landskron (AT)

(73) Assignee: Samsung Electronics Co., Ltd., Suwon-Si (KR)

( * ) Notice: Subject to any disclaimer, the term of this patent is extended or adjusted under 35 U.S.C. 154(b) by 468 days.

(21) Appl. No.: 11/411,341

(22) Filed: Apr. 26, 2006

(65) Prior Publication Data

US 2007/0252237 A1 Nov. 1, 2007

(51) Int. Cl.
H01L 29/72 (2006.01)

(52) U.S. Cl. .................. 257/529; 257/538; 438/132; 438/600; 365/94

(58) Field of Classification Search ............. 257/529, 257/538; 438/132, 600; 365/94
See application file for complete search history.

(56) References Cited

U.S. PATENT DOCUMENTS

| | | | | |
|---|---|---|---|---|
| 5,821,558 A * | 10/1998 | Han et al. | ...... | 257/52 |
| 5,844,297 A | 12/1998 | Crafts et al. | ...... | 257/530 |
| 5,882,998 A * | 3/1999 | Sur et al. | ...... | 438/601 |
| 5,899,707 A | 5/1999 | Sanchez et al. | ...... | 438/131 |
| 6,323,535 B1 | 11/2001 | Iyer et al. | ...... | 257/529 |
| 6,570,207 B2 | 5/2003 | Hsu et al. | ...... | 257/302 |
| 6,707,129 B2 | 3/2004 | Wang | ...... | 257/529 |
| 6,806,107 B1 | 10/2004 | Wu | ...... | 438/18 |
| 6,815,797 B1 | 11/2004 | Dark et al. | ...... | 257/530 |
| 2004/0222491 A1 | 11/2004 | Ito et al. | ...... | 257/529 |
| 2005/0052892 A1 * | 3/2005 | Low et al. | ...... | 365/94 |
| 2005/0277232 A1 * | 12/2005 | Wu et al. | ...... | 438/132 |

FOREIGN PATENT DOCUMENTS

| | | |
|---|---|---|
| JP | 2004228369 | 8/2004 |
| KR | 10-0276097 | 4/1997 |
| KR | 19990063480 | 7/1999 |
| KR | 10-0414239 | 11/1999 |
| KR | 19990082361 | 11/1999 |
| KR | 2002-0046933 | 6/2002 |
| WO | WO 97/29515 | 8/1997 |

OTHER PUBLICATIONS

Korean Office Action dated Feb. 26, 2008 for corresponding Korean Appln. No. 10-2007-0040031.

* cited by examiner

Primary Examiner—Edward Wojciechowicz
(74) Attorney, Agent, or Firm—F. Chau & Associates, LLC

(57) ABSTRACT

Electrically programmable integrated fuses are provided for low power applications. Integrated fuse devices have stacked structures with a polysilicon layer and a conductive layer formed on the polysilicon layer. The integrated fuses have structural features that enable the fuses to be reliably and efficiently programmed using low programming currents/voltages, while achieving consistency in fusing locations. For example, programming reliability and consistency is achieved by forming the conductive layers with varied thickness and forming the polysilicon layers with varied doping profiles, to provide more precise localized regions in which fusing events readily occur.

38 Claims, 4 Drawing Sheets

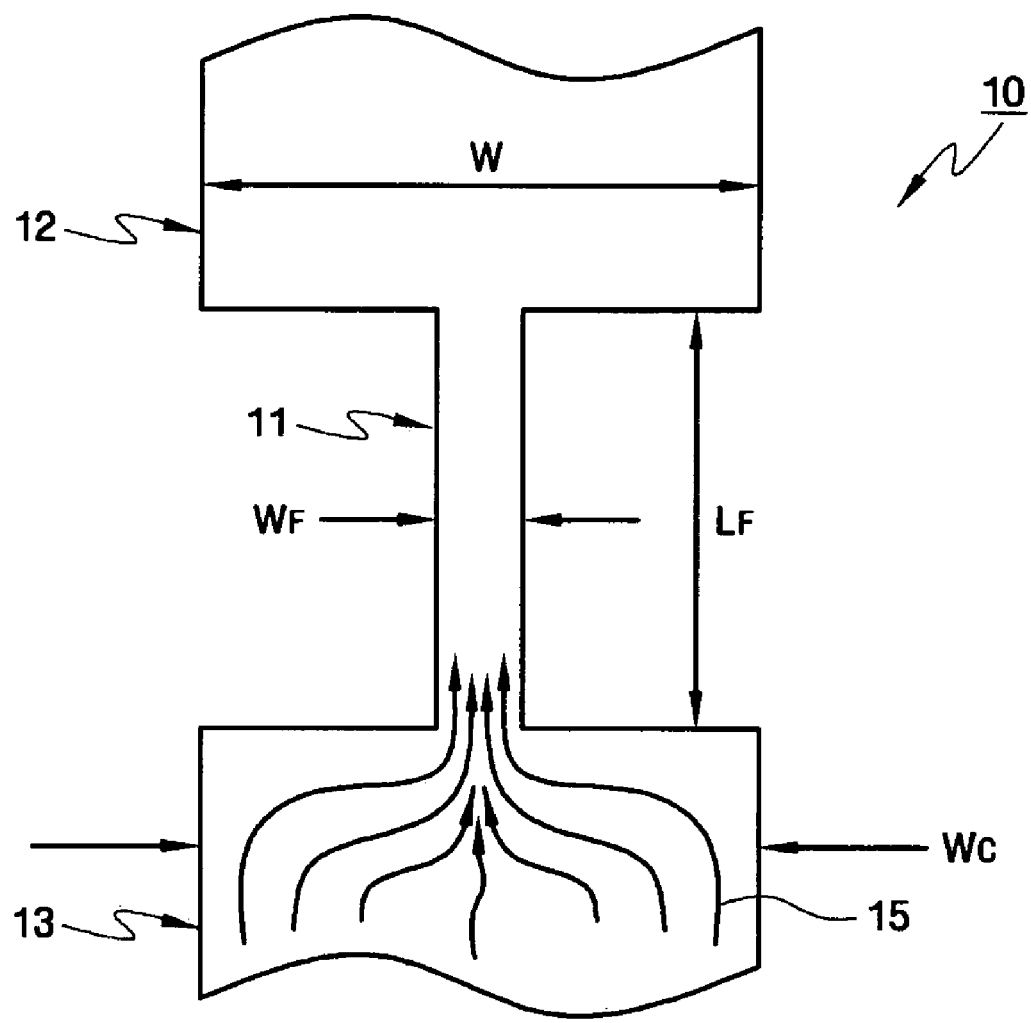

DEVICES AND METHODS FOR CONSTRUCTING ELECTRICALLY PROGRAMMABLE INTEGRATED FUSES FOR LOW POWER APPLICATIONS

TECHNICAL FIELD OF THE INVENTION

The present invention relates to programmable solid-state fuses and, more specifically, to electrically programmable polysilicon fuses that are designed for low power applications, as well as methods for constructing polysilicon fuses that can be reliably and efficiently programmed using low programming currents/voltages.

BACKGROUND

Semiconductor integrated fuses are utilized in various types of integrated circuit designs and applications. For instance, integrated fuses are utilized as programmable elements with memory devices (e.g., PROMs, SRAMs, etc.), redundancy for logic devices, programmable feature selection, etc. An integrated fuse can be programmed from a low resistance state to a high resistance state by applying an electric current of sufficient magnitude, and for a sufficient amount of time, to thereby heat the fuse to cause a fusing event (i.e., blow the fuse).

Currently, integrated circuit devices are being developed with higher degrees of integration with decreasing critical dimensions to enable low power applications. In this regard, the required internal power supply voltages and currents that are needed are becoming increasingly smaller. With smaller voltages/currents, however, it becomes more difficult to reliably blow fuses such as polysilicon fuses. Accordingly, integrated fuses structures are being developed to allow fuses to be programmed with reduced currents/voltages.

FIG. 1 is a schematic top plan layout (shape) of a conventional integrated fuse device. In particular, FIG. 1 depicts an integrated polysilicon fuse (10) which comprises a fuse link (11) of length $L_F$ and width $W_F$, which is connected between an anode (12) and a cathode (13). The polysilicon fuse (10) can be formed by patterning a polysilicon layer formed on a substrate and doping the polysilicon layer with N-type (N+) or P-type (P+) dopants, for example.

To enable programming at decreased currents/voltages, the polysilicon fuse (10) is designed such that a width $W_F$ of the fuse element (11) is made significantly smaller than the widths $W_C$ of the anode and cathode regions (12) and (13). The smaller width fuse link (11) provides a high resistance path between the anode and cathode (12) and (13), and the reduction in cross-sectional area between the anode (12)/cathode (13) and the fuse link (11) creates what is known as "current crowding". This effect is depicted in FIG. 1, where current (15) flowing from the larger area cathode (13) to the smaller area fuse link (11) causes current crowding at the region where the fuse link (11) interfaces to the cathode (13), when a bias is applied to program the fuse. The current crowding effect together with the increased resistance of the fuse link provides an increase in localized heating, which causes the fuse to open with smaller voltages and currents. Although this design generally allows for programming with reduced current/voltage, the fusing location can vary across fuses of similar structure, thus reducing programming reliability.

SUMMARY OF THE INVENTION

In general, exemplary embodiments of the invention include electrically programmable polysilicon fuses that are designed for low power applications. More specifically, electrically programmable polysilicon fuses according to exemplary embodiments of the invention include stacked structures having conductive layers formed on polysilicon layers, which are designed to provide localized regions of high resistance in which fuse events can be localized and readily initiated using low programming current and voltages to achieve fuse programming with high efficiency, reliability and consistency.

In one exemplary embodiment of the invention, a semiconductor integrated fuse includes a polysilicon layer comprising an anode, a cathode, a fuse link connected between the anode and cathode, and a conductive layer formed on the polysilicon layer. A first portion of the conductive layer formed over the fuse link has a first thickness T1 and a second portion of the conductive layer formed over the fuse link has a second thickness T2, where T2 is formed to be less than T1. The reduced thickness T2 of the second portion of the conductive layer provides a localized region of increased resistance in which a fusing event (e.g., melt or blow open the conductive layer) can be readily initiated by thermal stress generated with reduced currents/voltages to program the integrated fuse device.

In one embodiment of the invention, a conductive layer with variable thickness is a silicide layer such as titanium silicide, nickel silicide, platinum silicide, or cobalt silicide, for example. A silicide layer with variable thickness is achieved by varying the doping profile in different regions (anode, cathode and fuse link regions) of the polysilicon layer to control the amount of silicide formation in the different doped regions of the polysilicon layer. For instance, a polysilicon fuse link region can be formed with different poly regions including undoped regions and/or regions with different types of dopants and/or dopant concentrations to thereby inhibit or enhance silicide formation in the different regions and, thus, form a silicide layer with varied thickness as desired to localize fusing events.

In other exemplary embodiments of the invention, the doping profile of the polysilicon layer is varied over different regions of the polysilicon layer as a means to control the amount (thickness) of silicide formation as well as increase the ability to localize fusing events and control pre/post fuse resistance for low power applications.

For instance, in one exemplary embodiment of the invention, a fuse link region of the polysilicon layer is formed with different poly regions, where at least one poly region is a doped, electrically neutral poly region. The doping inhibits silicide formation such that a silicide layer is formed on the electrically neutral region which is thinner (higher resistance) than the silicide layers formed on adjacent poly regions. Moreover, the poly region is electrically neutral to provide a high resistance region which, during a programming operation, causes electrons flowing in the polysilicon at the junction between the electrically neutral poly region and an adjacent poly region to flow into the thin silicide layer, thereby increasing the vertical crowding and material migration in a manner which increases localization of thermal stress and enables more control to localize fusing events.

These and other exemplary embodiments, aspects, objects, features and advantages of the present invention will become apparent from the following detailed description of exemplary embodiments, which is to be read in connection with the accompanying drawings.

BRIEF DESCRIPTION OF THE DRAWINGS

FIG. 1 schematically illustrates a conventional semiconductor integrated fuse.

DETAILED DESCRIPTION OF EXEMPLARY EMBODIMENTS

Figure 2A:
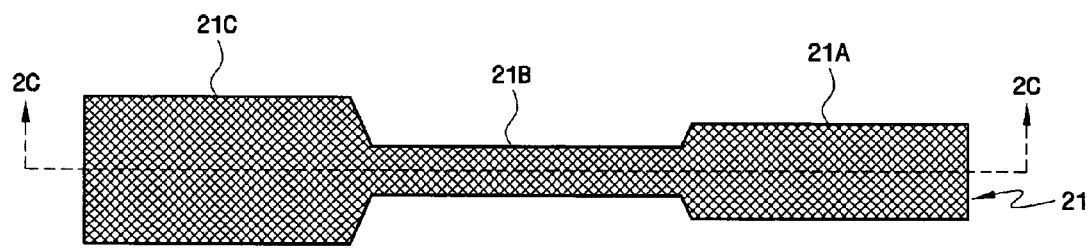
FIGS. 2A, 2B and 2C schematically illustrate a semiconductor integrated fuse according to an exemplary embodiment of the invention.

FIGS. 2A~2C, 3A~3B and 4A~4B schematically illustrate electrically programmable semiconductor integrated fuse structures according to exemplary embodiments of the invention, which are designed to provide programming efficiency and reliability for low power applications. In general, FIGS. 2A~2C, 3A~3B and 4A~4B depict integrated fuses having stacked structures that commonly include a conductive layer (e.g., silicide layer) formed on top of a polysilicon fuse layer having anode and cathode regions and a fuse link region connecting the anode and cathode regions.

The exemplary integrated fuse structures are electrically programmed by applying a programming current of sufficient magnitude to create a current stress that increases the fuse temperature and initiates agglomeration of the fuse conductive layer which results in a fusing event that programs the fuse into a high resistance state. The fusing event may be formation of discontinuities or voids at a fusing location of the conductive layer or otherwise melting or blowing open the conductive layer at a fusing location. In accordance with exemplary embodiments of the invention, integrated fuses are designed with structures that provide one or more localized high-resistance fuse regions, which enable the integrated fuses to be efficiently and consistently programmed with low programming currents/voltages and desired fusing locations.

It is to be understood that the drawings are merely schematic depictions where the thickness and dimensions of various elements, layers and regions are not to scale, but rather exaggerated for purposes of clarity. It is to be further understood that when a layer is described herein as being "on" or "over" another layer or substrate, such layer may be directly on the other layer or substrate, or intervening layers may also be present. It is to be further understood that the same reference numerals used throughout the drawings denote elements that are the same or similar or have the same or similar functions.

Figure 2B:
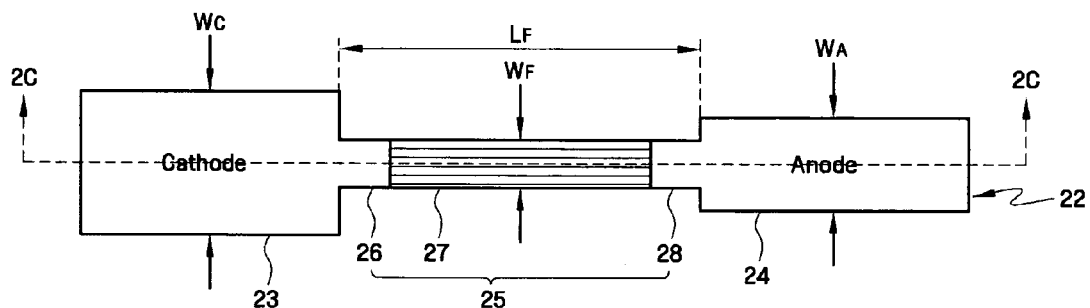
Figure 2C:
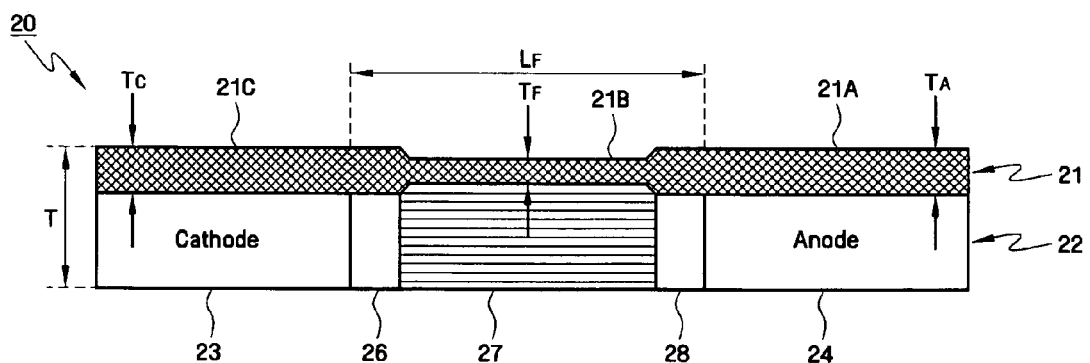

FIGS. 2A~2C schematically illustrate a semiconductor integrated fuse according to an exemplary embodiment of the invention. More specifically, FIGS. 2A~2C schematically illustrate an electrically programmable integrated fuse structure (20) comprising a conductive layer (21) formed on a polysilicon layer (22). FIGS. 2A and 2B are top plan views that schematically depict layout patterns of the conductive layer (21) and the polysilicon layer (22), respectively, according to exemplary embodiments of the invention. FIG. 2C is a schematic cross-sectional view of the exemplary fuse structure (20) along line 2C-2C in FIGS. 2A and 2B.

As generally depicted in FIGS. 2B and 2C, the polysilicon layer (22) comprises a plurality of polysilicon regions including doped cathode (23) and anode (24) regions, and a fuse link (25) region that connects the anode (24) and cathode (23) regions. The fuse link (25) region of the polysilicon layer (22) includes different doped poly regions (26), (27) and (28). The doped poly regions (26) and (28) are located at opposite ends of the fuse link (25) region and abut the cathode (23) and anode (24) regions, respectively. The doped poly region (27) is disposed between the poly regions (26) and (28). As explained below, the doping profile of the polysilicon layer (22) is varied over the different regions (23, 24, 25) as a means of controlling pre/post fuse resistance and localizing fusing events at desired regions along the fuse link (25).

As illustrated in FIG. 2B, the polysilicon cathode (23) region has a width $W_C$, the polysilicon anode (24) has a width $W_A$, and the polysilicon fuse link (25) region has a width $W_F$ and length $L_F$. In the exemplary embodiment, the width $W_F$ of the fuse link (25) region is smaller than the width $W_C$ of the cathode (23) and width $W_A$ of the anode (24).

As depicted in FIG. 2A, the conductive layer (21) formed on the polysilicon layer (22) has a layout pattern similar to the layout pattern of the polysilicon layer (22). In this regard, the conductive layer (21) is formed with different portions (21A), (21B) and (21C) having different widths. More specifically, portions (21A) and (21C) of the conductive layer (21) that are formed over the polysilicon anode (24) and cathode (23) regions, respectively, are larger in width than the portion (21C) of the conductive layer (21) formed over the polysilicon fuse link (25) region. As in conventional designs, the step reduction in the width of the conductive layer (21) between the anode (24)/cathode (23) and the fuse link (25) regions results in lateral "current crowding", In accordance with an exemplary embodiment of the invention, programming efficiency is further enhanced by providing step reductions in the thickness of the conductive layer (21). For instance, as depicted in FIG. 2C, the portion (21A) of the conductive layer (21) that is formed over the polysilicon anode (24) and doped region (28) has a thickness, $T_A$, a portion (21C) of the conductive layer (21) that is formed over the polysilicon anode (23) and doped region (26) has a thickness, $T_C$, and a portion (21C) of the conductive layer (21) that is formed over the doped poly region (27) of the polysilicon fuse link (25) has a reduced thickness, $T_F$. This reduced thickness region (21B) results in vertical "current crowding", and thus provides a localized region of higher resistance in the conductive layer (21) over the fuse link (25), there localizing a fusing event and allowing the fuse to be programmed using low programming current and voltages.

In one exemplary embodiment of the invention, the conductive layer (21) is a silicide layer that is formed on the polysilicon layer (22) using known methods. The silicide layer (21) can include titanium silicide, nickel silicide, platinum silicide, or cobalt silicide. The varying thickness of the silicide conductive layer (21) is achieved by forming doped polysilicon regions with different types of dopants and/or dopant concentrations. In the exemplary embodiment of FIG. 2C, the doped poly region (27) is doped in a manner that inhibits silicide formation as compared to the other doped regions (23, 26, 28 and 24), which results in the portion (21B) of the silicide conductive layer (21) being formed with a reduced thickness, $T_F$. The doped poly region (27) can be formed by ion-implantation of a neutral species or by N and/or P dopant species.

More specifically, in one exemplary embodiment of the invention, during a silicide process to form the conductive layer (21), the silicide formation over the polysilicon layer

(22) will be inhibited at regions of increased doping concentration. In the exemplary embodiment of FIG. 2C, the doped poly region (27) in the fuse link (25) region is formed with a higher doping concentration as compared to adjacent doped poly regions (26) and (28). As a result, the portion (21B) of the silicide layer (21) is formed with reduced thickness as compared to the portions of the silicide layer (21) that is formed over the lower doped regions. For example, the polysilicon regions (23) and (26) can be doped with a p-type dopant and the polysilicon regions (24) and (28) can be doped with an n-type dopant. Alternatively, the polysilicon regions (23) and (26) can be doped with an n-type dopant and the polysilicon regions (24) and (28) can be doped with a p-type dopant. The doped poly region (27) is a highly doped, but electrically neutral region that can be formed by implanting both N and P dopants into the region (27) during the separate ion implantations to form doped regions (23, 26) and (24, 28). In this manner, doped region (27) is essentially an overlap region of the doped region (23, 26) and the doped regions (24, 28) and subjected to both P and N ion implantations.

In other exemplary embodiments of the invention, the electrically neutral, doped polysilicon region (27) can be formed via ion implantation with a neutral species. For example, the neutral species may comprise silicon, germanium, argon, oxygen, nitrogen or fluorine.

To program the fuse (20), a programming voltage can be applied causing substantial current flow and thermal stress in the conductive layer (21). For instance, assume that the cathode (23) is n-doped and the anode (24) is p-doped, and that the cathode (23) is negatively biased and the anode (24) is positively biased. In this manner, electrons will flow from region (21C) to (21A) through (21B). The reduced width $W_F$ coupled with reduced thickness $T_F$ of the conductive portion (21B) of the conductive layer (21) over the doped region (27) results in both lateral and vertical current crowding which quickly initiates electro migration in the conductive portion (21B). Indeed, the electrically neutral doped region (27) provides a high resistance region which causes electrons flowing at the junction between regions (26) and (27) to flow upward into the conductive layer (21), which enhances vertical crowding and material migration in the portion (21B) of the fuse link region (25).

Consequently, current stress initiates agglomeration of the silicide material and causes all or a portion of the conductive layer portion (21B) of the fuse link region (25) to melt or otherwise agglomerate into a high resistance state (i.e., the fuse gets programmed). In the programmed state, the integrated fuse (20) has a significantly larger resistance as current must be conducted through the higher resistance, neutral doped region (27) (as opposed to the conductive portion (21B)).

In another exemplary embodiment of the invention, the doped region (27) can be a highly-doped N or P region (as compared to the other doped regions (23, 26, 28, 24), which is not electrically neutral. The high doping concentration of the doped region (27) will result in a thinner silicide layer (21B) formed over the doped poly region (27), which operates to localize the fuse blow. In this embodiment, a programming voltage can be applied such that the polysilicon layer (22) is reversed biased causing an increased depletion region at the junction of the doped region (27) and the regions (26) or (28) which aids in increasing agglomeration of the portion (21B) of the silicide conductive layer (21) near the depletion region and thus, localizing the fuse blow.

An integrated fuse device having an architecture based on that described above with reference to FIGS. 2A-2C can be formed using known semiconductor fabrication methods. In general, the integrated fuse (20) can be formed by depositing an undoped layer of poly silicon on a semiconductor substrate, and then etching the polysilicon layer to form the poly fuse layout pattern (e.g., as illustrated in FIG. 2B). The different doped regions of the polysilicon layer are then formed using suitable ion implantation masks and separate ion implantations procedures to implant dopant species (P and/or N) and/or neutral species at desired doses and concentrations.

Thereafter, a silicide layer can be formed by deposition of a metallic material such as cobalt, nickel, titanium, platinum and/or other silicide material, and proper heat treatments. In one exemplary embodiment, the metallic material can be deposited with a thickness of about 10 nm to about 30 nm. After silicidation, the integrated fuse is defined by removing/etching the non-silicide material (i.e., removing the remaining metallic material). In the exemplary embodiment of FIG. 2C, an initial metal layer thickness of 10~30 nm could result in a thickness $T_F$ equal to about 10~20 nm (where the silicide formation is inhibited by the doped region (27) and a thickness $T_A = T_C = 50$ nm (where doped regions (23, 26, 28 and 24) do not significantly inhibit silicide formation).

Figure 3A:
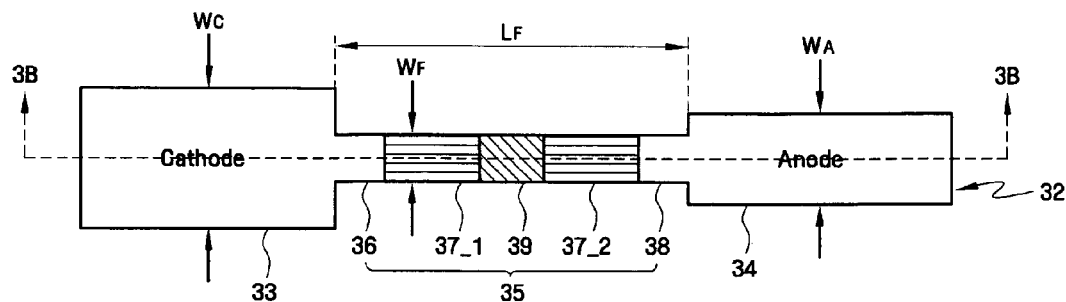
FIGS. 3A and 3B schematically illustrate a semiconductor integrated fuse according to another exemplary embodiment of the invention.
Figure 3B:
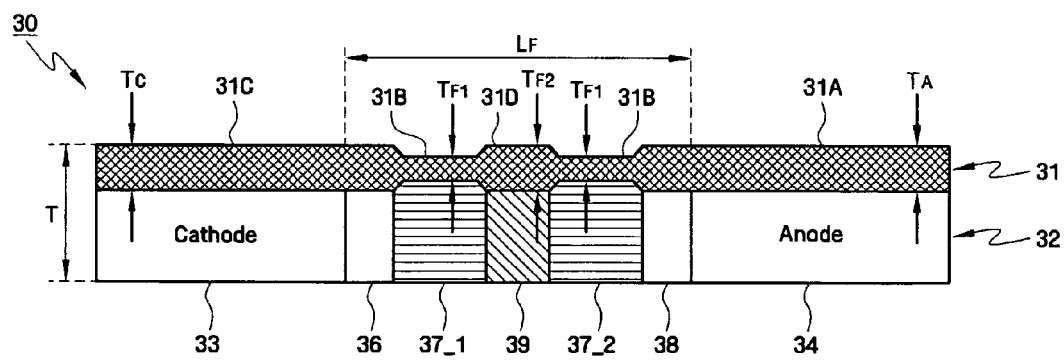

FIGS. 3A and 3B schematically illustrate a semiconductor integrated fuse according to another exemplary embodiment of the invention. In general, FIGS. 3A and 3B schematically illustrate an electrically programmable integrated fuse structure (30) comprising a conductive layer (31) formed on a polysilicon layer (32). FIG. 3A is a top plan view that schematically depicts a layout pattern of the polysilicon layer (32) and FIG. 3B is a schematic cross-sectional view of the exemplary fuse structure (30) along line 3B-3B in FIG. 3A.

As generally depicted in FIGS. 3A and 3B, the polysilicon layer (32) comprises a plurality of polysilicon regions including doped cathode (33) and anode (34) regions, and a fuse link (35) region that connects the anode (34) and cathode (33) regions. The fuse link (35) region of the polysilicon layer (32) includes different doped poly regions (36), (37-1), (37-2) and (38). The doped poly regions (36) and (38) are located at opposite ends of the fuse link (35) region and abut the cathode (33) and anode (34) regions, respectively. The doped poly regions (37-1) and (37-2) are highly doped, electrically neutral regions, which are separated by doped region (39).

The doping profile of the polysilicon layer (32) is varied over the different regions (33, 34, 35) to form the silicide layer (31) with varied thickness, as depicted in the exemplary embodiment of FIG. 3B. In FIG. 3B, the doped poly regions (37-1) and (37-2) in the fuse link (35) region are formed with a higher doping concentration as compared to adjacent doped poly regions (36), (38) and (39). As a result, the portions (31B) of the silicide layer (31) are formed with reduced thickness $T_{F1}$ as compared to the portions (31A), (31C) and (31D) of the silicide layer (31) that are formed over the lower doped regions (33), (36), (39), (38) and (34).

More specifically, in one exemplary embodiment of the invention, the polysilicon regions (33) and (36) can be p-doped while the polysilicon regions (34) and (38) are n-doped. Alternatively, the polysilicon regions (33) and (36) can be n-doped while the polysilicon regions (34) and (38) are p-doped. The doped poly region (39) can be p-doped or n-doped. The doped poly regions (37-1) and (37-2) are highly doped, but electrically neutral regions that can be formed by an ion-implantation of a neutral species or both PN dopant species, such as doped region (27) discussed above with reference to FIGS. 2A~2C.

The integrated fuse (30) in FIG. 3B is similar to the integrated fuse (20) in FIG. 2C and can be programmed using the methods discussed above. In the exemplary structure of FIG. 3B, the inclusion of the lower resistance poly and conductor regions (39) and (31D) enables a more uniform distribution of programming current, and thus application of current stress, to the higher resistance conductive regions (31B) to ensure that the agglomeration occurs along the entire length of the conductive regions (31B). In the fuse structure of FIG. 2C, depending on the programming conditions and fuse length $L_F$, agglomeration may or may not occur along the entire length of the conductive region (21B). In other words, the integrated fuse structure of FIG. 3B enables tighter control over the extent of fusing and the fusing location(s).

Figure 4A:
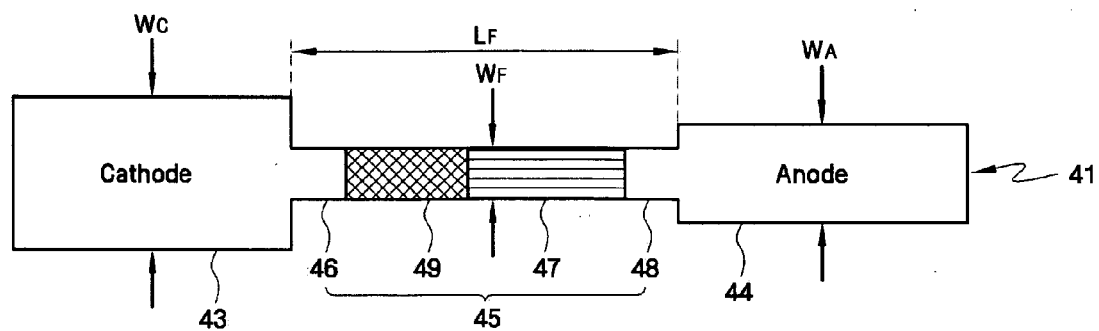
FIGS. 4A and 4B schematically illustrate a semiconductor integrated fuse according to another exemplary embodiment of the invention.
Figure 4B:
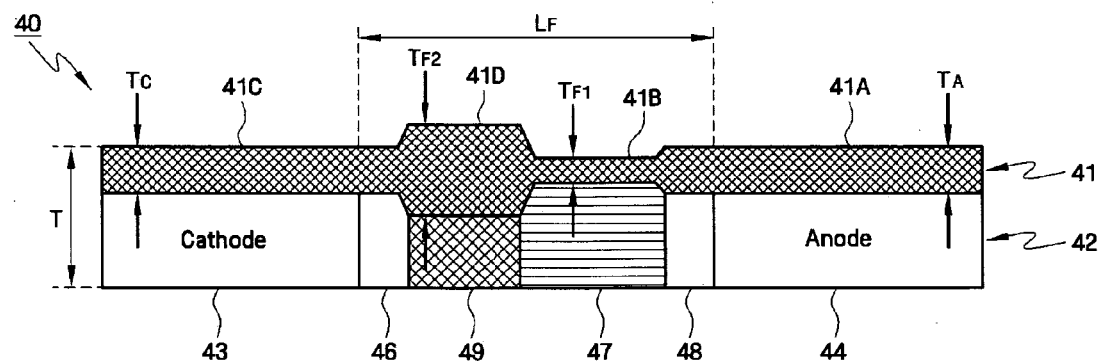

FIGS. 4A and 4B schematically illustrate a semiconductor integrated fuse according to another exemplary embodiment of the invention. In general, FIGS. 4A and 4B schematically illustrate an electrically programmable integrated fuse structure (40) comprising a conductive layer (41) formed on a polysilicon layer (42). FIG. 4A is a top plan view that schematically depicts a layout pattern of the polysilicon layer (42) and FIG. 4B is a schematic cross-sectional view of the exemplary fuse structure (40) along line 4B-4B in FIG. 4A.

As generally depicted in FIGS. 4A and 4B, the polysilicon layer (42) comprises a plurality of polysilicon regions including doped cathode (43) and anode (44) regions, and a fuse link (45) region that connects the anode (44) and cathode (43) regions. The fuse link (45) region of the polysilicon layer (42) includes different doped poly regions (46), (47), and (48) and undoped poly region (49). The doped poly regions (46) and (48) are located at opposite ends of the fuse link (45) region and abut the cathode (43) and anode (44) regions, respectively. The doped poly region (47) is a highly doped, electrically neutral region.

The doping profile of the polysilicon layer (42) is varied over the different regions (43, 44, 45) to form the silicide layer (41) with varied thickness, as depicted in the exemplary embodiment of FIG. 4B. In FIG. 4B, the doped poly region (47) in the fuse link (45) region is formed with a higher doping concentration as compared to adjacent doped poly regions (36), (38) and (49). As a result, the portion (41B) of the silicide layer (41) is formed with reduced thickness $T_{F1}$ as compared to the portions (41A), (41C) and (41D) of the silicide layer (41) that are formed over the lower doped regions (43), (46), (48) and (44), and undoped region (49).

More specifically, in one exemplary embodiment of the invention, the polysilicon regions (43) and (46) can be p-doped while the polysilicon regions (44) and (48) are n-doped. Alternatively, the polysilicon regions (43) and (46) can be n-doped while the polysilicon regions (44) and (48) are p-doped. The doped poly region (47) is a highly doped, but electrically neutral region that can be formed by an ion-implantation of a neutral species or both PN dopant species, such as doped region (27) discussed above with reference to FIGS. 2A-2C. The undoped region (49) yields a thicker portion (41D) of the silicide conductive layer (41), which operates to increase vertical current crowding and thus agglomeration along the conductive portion (41B) of the silicide layer (41) disposed over the doped, neutral region (47), when current flows from the conductive layer portion (41D) to the conductive layer portion (41B) during fuse programming. The increased vertical thickness of the conductive layer portion (41D) provides a means of localizing the fuse blow via current crowding effect, while maintaining the lateral width $W_F$ smaller for highly integrated, small pitch fuse layout designs.

While the present invention has been particularly shown and described with reference to exemplary embodiments thereof, it will be understood by those skilled in the art that various changes in form and details may be made therein without departing from the spirit and scope of the invention as defined by the appended claims.

We claim:

1. A semiconductor integrated fuse device, comprising: a polysilicon layer comprising an anode and cathode, and fuse link formed between the anode and cathode, wherein the fuse link comprises a first doped polysilicon region having a first dopant concentration and a second doped polysilicon region having a second dopant concentration that is greater than the first dopant concentration; a conductive layer formed on the polysilicon layer, wherein a thickness of the conductive layer over the fuse link varies, wherein a portion of the conductive layer over the first doped polysilicon region has a first thickness, wherein a portion of the conductive layer over the second doped polysilicon region has a second thickness that is less than the first thickness,
   wherein the second doped polysilicon region is an electrically neutral doped polysilicon region, and wherein the first doped polysilicon region includes n-type dopants or p-type dopants.

2. The device of claim 1, wherein the first doped polysilicon region is doped with p-type or n-type dopants, and wherein the second doped polysilicon region is doped with p-type or n-type dopants.

3. The device of claim 1, wherein the second doped polysilicon region is doped polysilicon with neutral species.

4. The device of claim 3, wherein the neutral species comprises silicon, germanium, argon, oxygen, nitrogen or fluorine.

5. The device of claim 1, wherein the second doped polysilicon region is disposed in a center region of the fuse link between the anode and cathode.

6. The device of claim 1, wherein a width $W_A$ of the anode and width $W_C$ of the cathode are greater than a width $W_F$ of the fuse line.

7. The device of claim 6, wherein $W_C$ is greater than $W_A$.

8. The device of claim 1, wherein the conductive layer is a metal silicide layer.

9. The device of claim 1, wherein the cathode is doped polysilicon with N-type dopants and wherein the anode is doped polysilicon with P-type dopants.

10. A semiconductor integrated fuse device, comprising: a polysilicon layer comprising an anode and cathode, and fuse link formed between the anode and cathode, wherein the fuse link comprises a first doped polysilicon region having a first dopant concentration and a second doped polysilicon region having a second dopant concentration that is greater than the first dopant concentration; a conductive layer formed on the polysilicon layer, wherein a thickness of the conductive layer over the fuse link varies, wherein a portion of the conductive layer over the first doped polysilicon region has a first thickness, wherein a portion of the conductive layer over the second doped polysilicon region has a second thickness that is less than the first thickness,
   wherein the fuse link further comprises a third doped polysilicon region having a third dopant concentration that is less than the second dopant concentration of the second doped polysilicon region, wherein the second doped polysilicon region is disposed between the first and third doped polysilicon regions.

11. The device of claim 10, wherein the first doped polysilicon region comprises a first dopant type, wherein the third doped polysilicon region comprises a second dopant type which is opposite the first dopant type.

12. The device of claim 11, wherein the second doped polysilicon region is an overlap region of the first and third doped polysilicon regions, wherein the second doped polysilicon region includes both n-type and p-type dopants.

13. The device of claim 10, wherein a portion of the conductive layer over the third doped polysilicon region has a third thickness that is greater than the second thickness.

14. The device of chin 13, wherein the first and third thickness are substantially the same.

15. A semiconductor integrated fuse device, comprising: a polysilicon layer comprising an anode and cathode, and fuse link formed between the anode and cathode, wherein the fuse link comprises a first doped polysilicon region having a first dopant concentration and a second doped polysilicon region having a second dopant concentration that is greater than the first dopant concentration; a conductive layer formed on the polysilicon layer, wherein a thickness of the conductive layer over the fuse link varies, wherein a portion of the conductive layer over the first doped polysilicon region has a first thickness, wherein a portion of the conductive layer over the second doped polysilicon region has a second thickness that is less than the first thickness,
wherein the fuse link further comprises a fourth undoped polysilicon region wherein a portion of the conductive layer over the fourth undoped polysilicon region has a fourth thickness that is greater than the first thickness and the second thickness.

16. The device of claim 15, wherein the second doped polysilicon region and fourth undoped polysilicon region are disposed adjacent.

17. The device of claim 16, wherein the fourth undoped polysilicon region is disposed between the first and second doped polysilicon regions.

18. The device of claim 17, wherein the first doped polysilicon region of the fuse link is disposed adjacent to the anode or cathode.

19. A semiconductor integrated fuse device, comprising: a polysilicon layer comprising an anode and cathode, and fuse link formed between the anode and cathode, wherein the fuse link comprises a first doped polysilicon region having a first dopant concentration and a second doped polysilicon region having a second dopant concentration that is greater than the first dopant concentration; a conductive layer formed on the polysilicon layer, wherein a thickness of the conductive layer over the fuse link varies, wherein a portion of the conductive layer over the first doped polysilicon region has a first thickness, wherein a portion of the conductive layer over the second doped polysilicon region has a second thickness that is less than the first thickness, wherein the fuse link further comprises a fifth doped polysilicon region having a fifth dopant concentration that is greater than the first dopant concentration, wherein the first doped polysilicon region is disposed between the second and fifth doped polysilicon regions, wherein a portion of the conductive layer over the fifth doped polysilicon region has a fifth thickness that is less than the first thickness.

20. The device of claim 19, wherein the second thickness and the fifth thickness of the conductive layer are substantially the same.

21. The device of claim 19, wherein the second and fifth doped polysilicon regions are electrically neutral regions.

22. The device of claim 21, wherein the first doped polysilicon region includes p-type or n-type dopants.

23. The device of claim 19, wherein the first doped polysilicon region is disposed in a center region of the fuse link between the anode and cathode.

24. A semiconductor integrated fuse device, comprising: a polysilicon layer comprising an anode and a cathode, and a fuse link connected between the anode and cathode; and a conductive layer formed on the polysilicon layer, wherein a first portion of the conductive layer formed over the fuse link has a first thickness T1, wherein a second portion of the conductive layer formed over the fuse link has a second thickness T2, and wherein T2 is formed to be less than T1 such that the second portion of the conductive layer provides a high resistance region in which a fusing event is initiated to program the integrated fuse device,
wherein the second portion of the conductive layer is disposed over a doped polysilicon, electrically neutral, polysilicon region of the fuse link.

25. The device of claim 24, wherein the first and second portions of the conductive layer are adjacent such that the conductive layer has a transition region from T1 to T2 where current crowding occurs.

26. The device of claim 24, wherein the conductive layer is a metal silicide layer.

27. A semiconductor integrated fuse device, comprising: a polysilicon layer comprising an anode and a cathode, and a fuse link connected between the anode and cathode; and a conductive layer formed on the polysilicon layer, wherein a first portion of the conductive layer formed over the fuse link has a first thickness T1, wherein a second portion of the conductive layer formed over the fuse link has a second thickness T2, and wherein T2 is formed to be less than T1 such that the second portion of the conductive layer provides a high resistance region in which a fusing event is initiated to program the integrated fuse device, wherein the first portion of the conductive layer is disposed over an undoped polysilicon region of the fuse link.

28. A method for forming a semiconductor integrated fuse device, comprising: forming a polysilicon layer on a semiconductor substrate, wherein the polysilicon layer comprises an anode and cathode, and fuse link formed between the anode and cathode; forming a first doped polysilicon region in the fuse link having a first dopant concentration; forming a second doped polysilicon region in the fuse link having a second dopant concentration that is greater than the first dopant concentration, forming a conductive layer on the polysilicon layer, wherein the conductive layer over the fuse link is formed to have a variable thickness, wherein a portion of the conductive layer over the first doped polysilicon region has a first thickness, wherein a portion of the conductive layer over the second doped polysilicon region has a second thickness that is less than the first thickness, wherein the second doped polysilicon region in the fuse link is electrically neutral.

29. The method of claim 28, further comprising forming a third doped polysilicon region having a third dopant concentration that is less than the second dopant concentration of the second doped polysilicon region, wherein the second doped polysilicon region is formed between the first and third doped polysilicon regions.

30. The method of claim 29, wherein the first doped polysilicon region is doped with N-type dopants, and wherein the third doped polysilicon region is doped with P-type dopants.

31. The method of claim 29, wherein a portion of the conductive layer over the third doped polysilicon region is formed having a third thickness that is greater than the second thickness.

32. The method of claim 31, wherein the first and third thickness are substantially the same.

33. A method for forming a semiconductor integrated fuse device, comprising: forming a polysilicon layer on a semiconductor substrate, wherein the polysilicon layer comprises an anode and cathode, and fuse link formed between the anode and cathode; forming a first doped polysilicon region in the fuse link having a first dopant concentration; forming a second doped polysilicon region in the fuse link having a second dopant concentration that is greater than the first dopant concentration; forming a conductive layer on the polysilicon layer, wherein the conductive layer over the fuse link is formed to have a variable thickness, wherein a portion of the conductive layer over the first doped polysilicon region has a first thickness, wherein a portion of the conductive layer over the second doped polysilicon region has a second thickness that is less than the first thickness, further comprising forming a fourth undoped polysilicon region in the fuse link, wherein a portion of the conductive layer over the fourth undoped polysilicon region is formed to have a fourth thickness that is greater than the first thickness and the second thickness.

34. The method of claim 33, wherein the second doped polysilicon region and fourth undoped polysilicon region are formed to be adjacent.

35. The method of claim 34, wherein the fourth undoped polysilicon region is formed between the first and second doped polysilicon regions.

36. A method for forming a semiconductor integrated fuse device, comprising: forming a polysilicon layer on a semiconductor substrate, wherein the polysilicon layer comprises an anode and cathode, and fuse link formed between the anode and cathode; forming a first doped polysilicon region in the fuse link having a first dopant concentration; forming a second doped polysilicon region in the fuse link having a second dopant concentration that is greater than the first dopant concentration; forming a conductive layer on the polysilicon layer, wherein the conductive layer over the fuse link is formed to have a variable thickness, wherein a portion of the conductive layer over the first doped polysilicon region has a first thickness, wherein a portion of the conductive layer over the second doped polysilicon region has a second thickness that is less than the first thickness, further comprising forming a fifth doped polysilicon region in the fuse link having a fifth dopant concentration that is greater than the first dopant concentration, wherein the first doped polysilicon region is formed between the second and fifth doped polysilicon regions, wherein a portion of the conductive layer over the fifth doped polysilicon region is formed to have a fifth thickness that is less than the first thickness.

37. The method of claim 36, wherein the second and fifth doped polysilicon regions are electrically neutral.

38. The method of claim 28, wherein forming a conductive layer on the polysilicon layer, comprises: forming a metallic material layer over the polysilicon layer; and performing an anneal process to form a silicide layer using the metallic material, wherein the silicide layer is formed over the fuse link with varying thickness that is effected by varying a dopant concentration polysilicon regions of the fuse link.

* * * * *

UNITED STATES PATENT AND TRADEMARK OFFICE
CERTIFICATE OF CORRECTION

PATENT NO. : 7,576,407 B2 Page 1 of 1
APPLICATION NO. : 11/411341
DATED : August 18, 2009
INVENTOR(S) : Young-Gun Ko et al.

It is certified that error appears in the above-identified patent and that said Letters Patent is hereby corrected as shown below:

On the Title page

(73) Assignee: Samsung Electronics Co., Ltd. and Infineon Technologies North America Corporation.

Signed and Sealed this

Fifteenth Day of June, 2010

David J. Kappos
*Director of the United States Patent and Trademark Office*